United States Patent
Lin et al.

(10) Patent No.: US 7,795,601 B2
(45) Date of Patent: Sep. 14, 2010

(54) METHOD AND APPARATUS TO IMPROVE LITHOGRAPHY THROUGHPUT

(75) Inventors: Chin-Hsiang Lin, Hsin-Chu (TW);
Jui-Chung Peng, Hsin-Chu (TW);
Yung-Cheng Chen, Hsin-Chu (TW);
Shy-Jay Lin, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 381 days.

(21) Appl. No.: 11/421,590

(22) Filed: Jun. 1, 2006

(65) Prior Publication Data

US 2007/0278424 A1 Dec. 6, 2007

(51) Int. Cl.
*C12Q 1/68* (2006.01)
*H01J 40/00* (2006.01)

(52) U.S. Cl. .............. 250/492.2; 250/492.22; 250/548; 250/310; 250/305; 250/306; 359/290; 359/291; 359/292; 355/53; 355/67; 355/69; 355/71; 430/30; 430/311

(58) Field of Classification Search .............. 250/492.2, 250/492.22, 200, 548, 310, 305, 306; 359/290, 359/291, 292; 355/53, 67, 69, 71; 430/30, 430/311
See application file for complete search history.

(56) References Cited

U.S. PATENT DOCUMENTS

| 6,341,007 | B1 | 1/2002 | Nishi et al. |
| 6,400,441 | B1 | 6/2002 | Nishi et al. |
| 6,492,077 | B1 | 12/2002 | Lin |
| 6,509,955 | B2 * | 1/2003 | Mei et al. .................. 355/53 |
| 6,846,618 | B2 | 1/2005 | Hsu et al. |
| 2003/0025981 | A1 * | 2/2003 | Ishikawa et al. ............ 359/290 |

FOREIGN PATENT DOCUMENTS

| CN | 1322971 A | 11/2001 |
| CN | 1447385 A | 10/2003 |
| CN | 1448786 A | 10/2003 |
| EP | 0 951 054 B1 | 8/2008 |

* cited by examiner

*Primary Examiner*—Bernard E Souw
*Assistant Examiner*—Meenakshi S Sahu
(74) *Attorney, Agent, or Firm*—Haynes and Boone, LLP

(57) ABSTRACT

The present disclosure provides a lithography apparatus with improved lithography throughput. The lithography apparatus includes a first lens system; a first substrate stage configured to receive a first radiation energy from the first lens system, and designed operable to move a substrate during an exposing process; a second lens system, having a higher resolution than that of the first lens system; and a second substrate stage approximate to the first substrate stage and configured to receive a second radiation energy from the second lens system, and designed operable to receive the substrate from the first substrate stage and move the substrate.

20 Claims, 3 Drawing Sheets

US 7,795,601 B2

METHOD AND APPARATUS TO IMPROVE LITHOGRAPHY THROUGHPUT

BACKGROUND

Semiconductor integrated circuit (IC) technology is continually progressing to circuit layouts having smaller feature sizes as well as increased density. As a result of this continuous progression, photolithography equipment has continually become more expensive and more complex. Continued improvements to lithography equipment and throughput are therefore desired.

BRIEF DESCRIPTION OF THE DRAWINGS

The present disclosure is best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. Furthermore, all features may not be shown in all drawings for simplicity.

DETAILED DESCRIPTION

The present disclosure relates generally to lithography systems and a method of utilizing such systems. It is understood, however, that the following disclosure provides many different embodiments, or examples, for implementing different features of the invention. Specific examples of components and arrangements are described below to simplify the present disclosure. These are, of course, merely examples and are not intended to be limiting.

Figure 1:
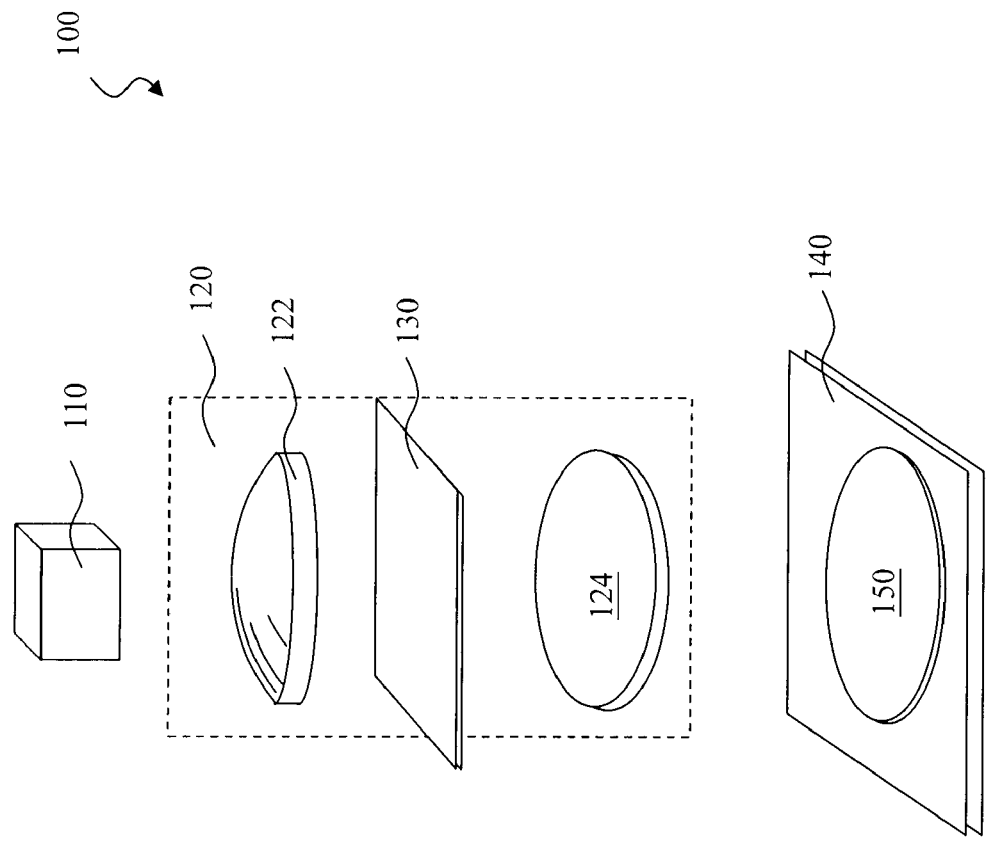
FIG. 1 is a schematic view of an exemplary embodiment of a lithography apparatus with dual substrate stages and dual lens systems.
Figure 1:
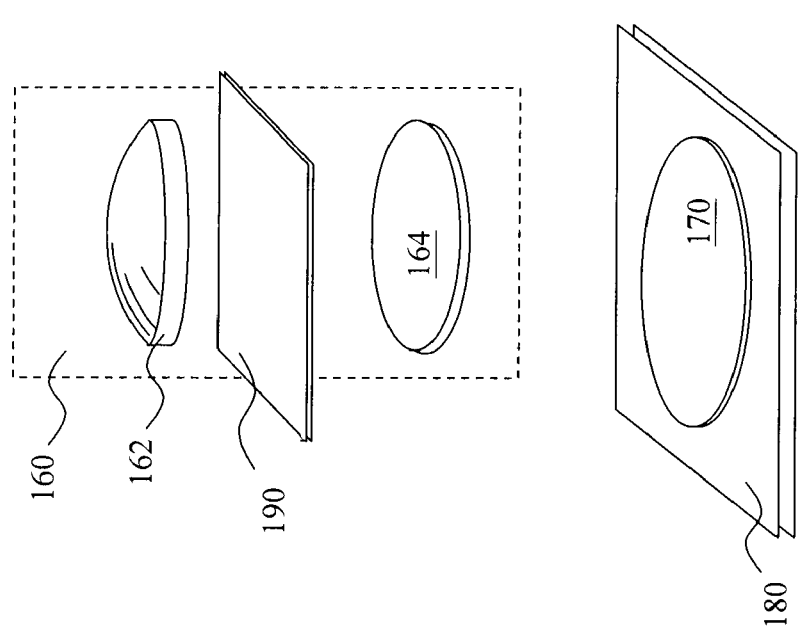

Referring to FIG. 1, illustrated is a schematic view of an exemplary embodiment of a lithography apparatus 100. The lithography apparatus 100 has multiple substrate stages and multiple lens systems, as discussed in greater detail below.

The lithography apparatus 100 includes a radiation source 110 to provide radiation beams (radiation energy). The radiation source 110 may be a suitable light source such as an ultra-violet (UV), deep ultra-violet (DUV), or extreme ultra-violet (EUV) source. For example, the radiation source 110 may be, but not limited to, a mercury lamp having a wavelength of 436 nm (G-line) or 365 nm (I-line); a Krypton Fluoride (KrF) excimer laser with wavelength of 248 nm; an Argon Fluoride (ArF) excimer laser with a wavelength of 193 nm; a Fluoride ($F_2$) excimer laser with a wavelength of 157 nm; or other light sources having a wavelength below approximately 100 nm. The radiation source 110 may provide at least two radiation beams by a suitable way including by providing a plurality of sub-radiation source elements and by splitting a beam using a beam splitter.

The lithography apparatus 100 includes a first lens system 120 to project radiation energy for lithography patterning. The first lens system 120 further includes an illumination module (e.g., a condenser) 122 having a single lens, or multiple lenses and other lens components. For example, the illumination module 122 may include microlens arrays, shadow masks, or other structures designed to aid in directing radiation beams from the radiation source 110 onto a photomask ("mask" or "reticle").

The first lens system 120 also includes an imaging lens module 124. The imaging lens module 124 may have a single lens or a plurality of lens elements configured to project the radiation beam onto a substrate.

A first mask 130 may be used in the lithography apparatus 100 during a lithography process. The first mask 130 may include a transparent substrate and an absorption layer. The transparent substrate may use fused silica ($SiO_2$), borosilicate glass, or soda-lime glass. The absorption layer may be formed using a plurality of processes and materials, such as depositing a metal film made with chromium (Cr), iron oxide, or an inorganic film made with MoSi, ZrSiO, SiN, and/or TiN. The absorption layer may be patterned to have one or more openings where radiation beams may travel through without being absorbed and have one or more absorption areas where the radiation beams may be completely or partially blocked thereby. In one example, the mask 130 may be an alternating phase shift mask (AltPSM), employing alternating areas of chrome and 180 degree-shifted quartz. Alternatively, the first mask 130 may be a binary intensity mask (BIM or binary mask) including chrome areas and transparent quartz areas. The first mask 130 is operable to move in translational and rotational modes.

The lithography apparatus 100 may further include a first mask stage (not shown) having a scan function. The first mask stage is operable to hold the mask and manipulate the mask in transitional and/or rotational modes.

The lithography apparatus 100 includes a first substrate stage 140 for holding and manipulating a substrate 150 to be patterned in transitional and/or rotational modes during a lithography patterning process. It is understood that the manipulation of the substrate 150 is considered relative to the first mask 130, so that one or both of the mask and stage can actually move to achieve the desired manipulation. The first substrate stage 140 may be designed to implement a step-and-scan process. The substrate 150 may be a semiconductor wafer having silicon, germanium, diamond, or a compound semiconductor. The substrate 150 may alternatively include other materials such as glass for thin-film transistor liquid crystal display (TFT_LCD) devices or fused silicon/calcium fluoride for photomask. The substrate 150 may include a plurality of layers formed thereon, each having patterned structures. The substrate 150 may include a material layer formed thereon and to be patterned. The substrate 150 may be further coated with an imaging layer for lithography patterning process such as photoresist. An exemplary photoresist includes chemical amplification photoresist (CAR).

The lithography apparatus 100 also includes a second lens system 160 having a lower resolution relative to the first lens system 120. Similarly, the second lens system 160 includes an illumination module 162 and an imaging lens module 164 configured to project radiation beams to a substrate 170 positioned on a second substrate stage 180. The second lens system may be made of low cost parts including various lenses since its low resolution.

The second substrate stage 180 may be substantially similar to the first substrate stage 140 in terms of structure. The second substrate stage 180 is configured approximate to the first substrate stage 140 and operable to move in translational and/or rotational modes for alignment, leveling, and exposing processes such as step-and-scan exposing processes. Furthermore, the first and second substrate stages 140 and 180 are designed to be operable to transfer a substrate between each other. A second mask 190 may be included during a lithography process and positioned such that the radiation beams through the second lens system 160 carries a pattern image defined on the second mask 190 and are projected onto the substrate 170 positioned on the second substrate stage 180.

The second mask 190 may be similar to the first mask 130 in term of material. In the present embodiment, however, the second mask 190 is different from the first mask 130 in that it includes various dummy features (or dummy patterns) formed thereon. Dummy patterns are designed to balance etch load and/or provide CMP uniformity and are to be transferred to edge partial fields of a wafer in a lithography process. Therefore, such a second mask can be used for all productions or a subset of productions.

As described above, the lithography apparatus 100 has multiple substrate stages and lens systems. The first lens system 120 is associated with the first substrate stage 140. The second lens system 160 has a lower resolution than the first and is associated with the second substrate stage 180. The radiation beams to the second lens system 160 may come from the radiation source 110. For example, the radiation beams from the radiation source 110 can be divided utilizing a beam splitter or half transparent glass. Alternatively, a second radiation source (not shown) may be used to provide radiation beams to the second lens system 160.

Figure 2:
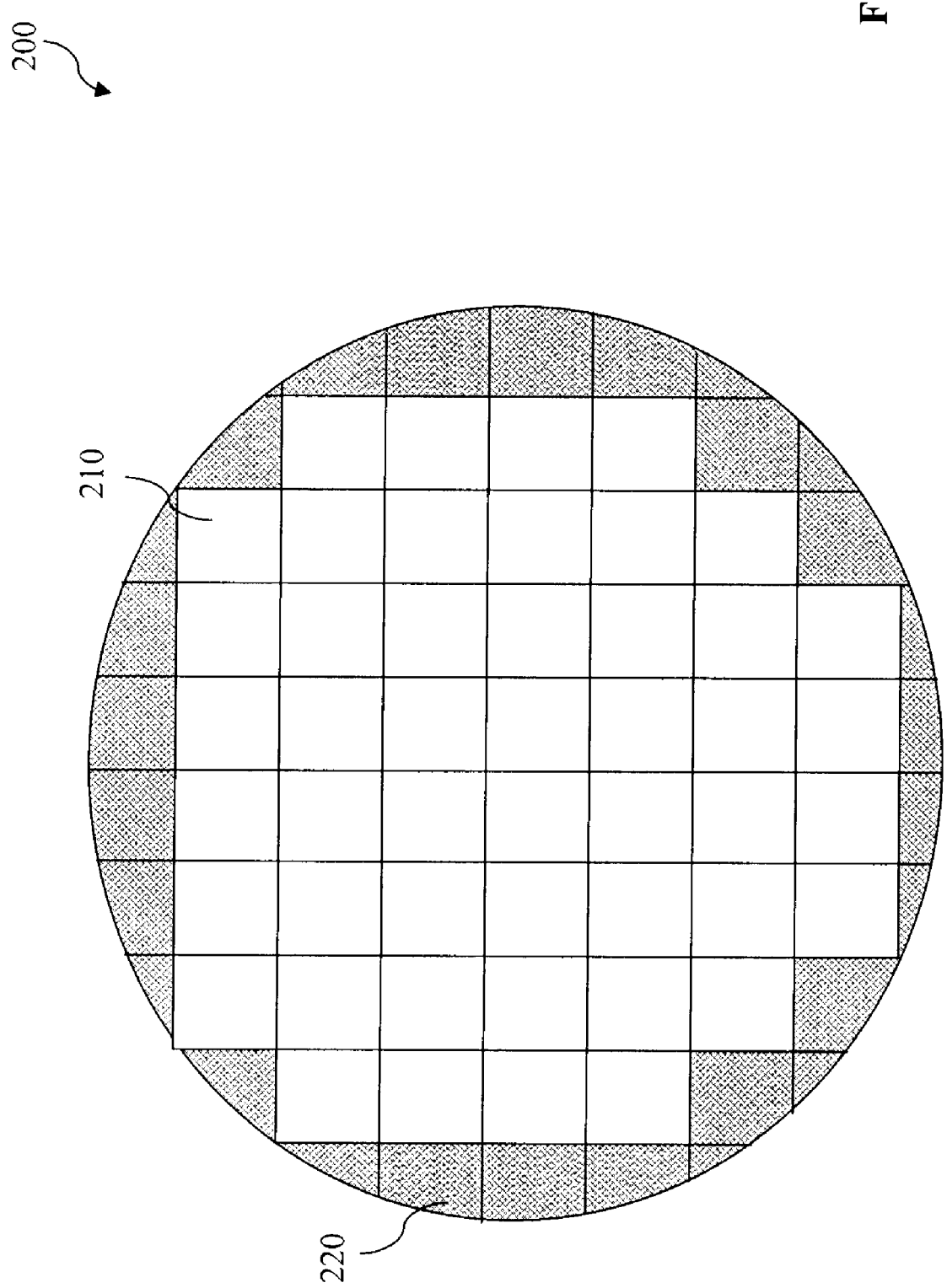
FIG. 2 illustrates a top view of one embodiment of a semiconductor wafer to be processed in the lithography apparatus of FIG. 1.

FIG. 2 illustrates an exemplary semiconductor wafer 200. The wafer 200 represents the wafers 150, 170 discussed above with respect to FIG. 1 in various stages of completion. The wafer 200 includes a plurality of areas, referred to as fields. During a lithography process, the wafer is exposed one field at a time. One field may include one die or more disposed therein. The wafer 200 includes a plurality of major fields 210 having complete IC circuits defined therein for one or more dies. The semiconductor wafer 200 further includes a plurality of partial fields 220 disposed on wafer edge areas. The partial fields 220 may not have complete circuit patterns (limited by wafer geometry) and therefore will be scrapped if no functional IC dies exist. However, partial fields 220 are exposed during a lithography process to balance etch load and provide CMP uniformity.

Figure 3:
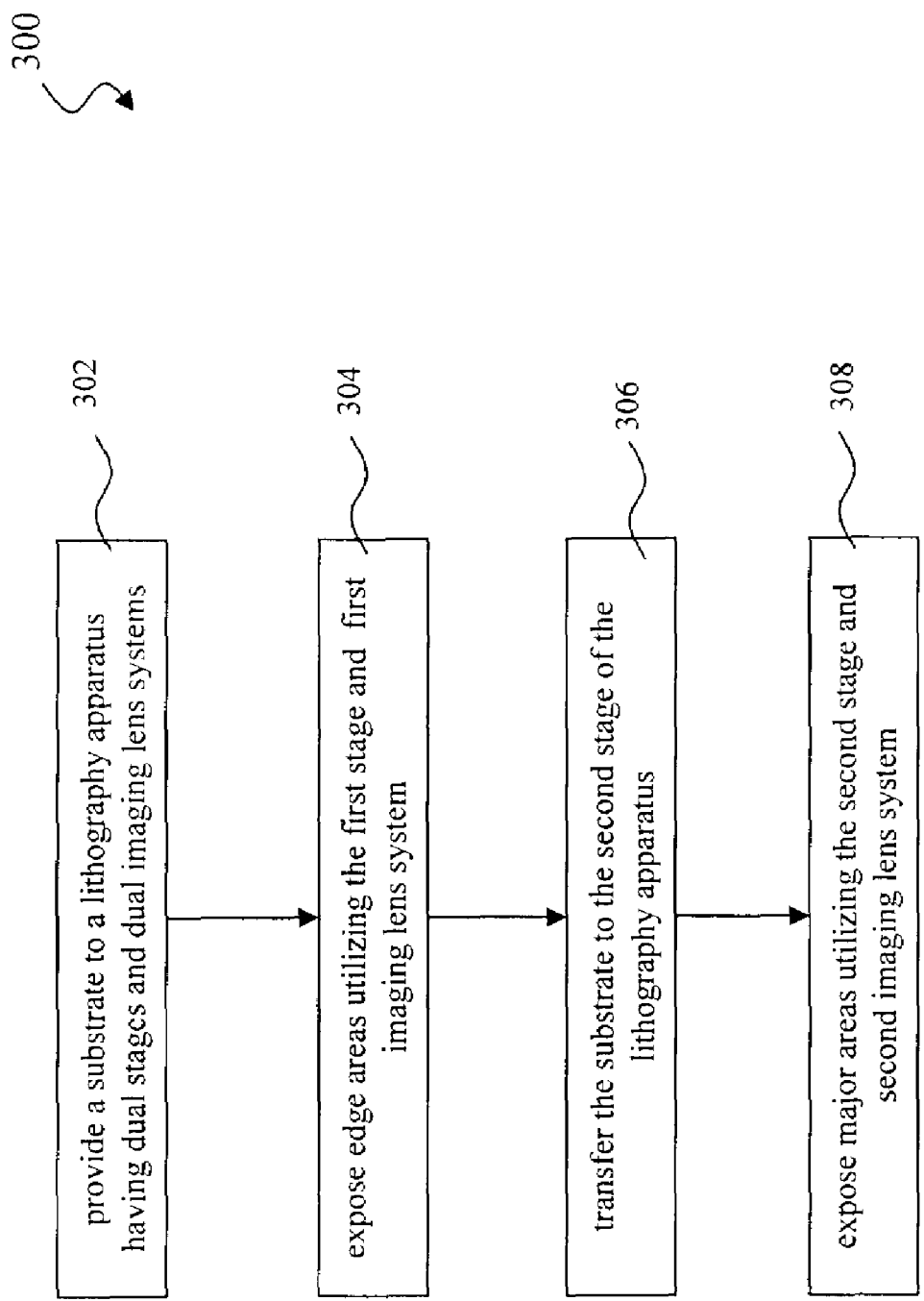
FIG. 3 is a flowchart of one embodiment of a method utilizing the lithography apparatus of FIG. 1.

Referring also to FIG. 3, a process 300 of utilizing the lithography apparatus 100 is described below with additional reference to the wafer 200. The process 300 begins at step 302 by providing a substrate to the lithography apparatus 100 having dual substrate stages and dual lens systems. The substrate may be a semiconductor wafer or other substrates to be patterned such as a glass substrate for TFT LCD devices or fused quartz/calcium fluoride substrate for mask. In the present example, the substrate is the semiconductor wafer 200. The substrate 200 may further include multiple patterned layers formed therein and/or thereon such as doped regions, shallow trench isolation (STI), poly-silicon gates, and metal lines and vias. The substrate 200 may include a material layer to be patterned. The substrate may be further coated with an imaging layer such as photoresist. An exemplary photoresist includes chemical amplification photoresist (CAR). The substrate may be further baked. The substrate is loaded to the substrate stage 180 and initialized such as being oriented, aligned, and leveled.

The process 300 proceeds to step 304 by exposing wafer edge partial fields to form dummy patterns therein utilizing the lens system 160 and a generic mask having dummy patterns. Since the dummy patterns formed on the partial fields aim to provide uniform pattern density for improved CMP and/or etch processes, the resolution requirement can be low and relaxed. Therefore the lens system 160 can be a low-cost lens system. The dummy patterns defined in the generic mask for partial fields can be designed according manufacturing data such as CMP data and etching data.

The process 300 proceeds to step 306 by transferring the substrate 200 from the substrate stage 170 to the substrate stage 140.

The process 300 proceeds to step 308 by exposing major fields 210 of the substrate 200 utilizing a mask having predefined IC patterns and the lens system 120. Since IC patterns formed on the major fields requires high resolution, the lens system 120 has a resolution higher than that of lens system 160. As the exposing process applied to the partial fields are implemented at step 304 by utilizing the low resolution lens system 160, therefore, the exposing process utilizing the high resolution lens system 120 is applied only to major fields and the processing time is shortened. The overall throughput of the lithography apparatus 100 is therefore improved.

The present disclosure provides various embodiments of a lithography apparatus and a method to utilize the lithography apparatus. Other variations may also be possible within the scope of the invention. The process 300 may implement the processing steps in different sequences. For example, the major fields of a substrate may be exposed utilizing the high resolution lens system. Thereafter, the wafer can be transferred to the other substrate stage and the wafer edge partial fields are exposed utilizing the low resolution lens system. In another variation, the exposing processes to the major fields and partial fields may be implemented in different lithography apparatus. For example, a wafer may be sent to a low resolution lithography tool to pattern partial fields and then transferred to a high resolution lithography tool to pattern major fields, or in a different sequence. In another embodiment, the lithography apparatus may be designed and configured for implementing immersion lithography processes for exposing some fields (e.g., the major fields) of the wafer.

Thus, the present disclosure provides an lithography apparatus. In one embodiment, the lithography apparatus includes a first lens system and a first substrate stage configured to receive a first radiation energy from the first lens system. The first substrate stage is also designed operable to move a substrate during an exposing process. The apparatus also includes a second lens system, having a higher resolution than that of the first lens system, and a second substrate stage approximate to the first substrate stage and configured to receive a second radiation energy from the second lens system. The second substrate stage is designed operable to receive the substrate from the first substrate stage and move the substrate during another exposure process.

In some embodiments, the first substrate stage may be operable to align and level the substrate. The first lens may be configurable to incorporate the first radiation energy with image information from a first mask and expose edge fields of the substrate positioned on the first substrate stage. The first mask may include a dummy pattern to be transferred on edge fields of the substrate. The first mask may be selected from a set of masks designed for forming dummy patterns on various substrates. The second lens may be configurable to incorporate the second radiation energy with image information from a second mask and expose edge fields of the substrate positioned on the second substrate stage. The lithography apparatus may further include a radiation source configured to provide at least one of the first radiation energy and the second radiation energy.

The present disclosure also provides a lithography apparatus that includes a first substrate stage and a second substrate stage designed for securing and moving a substrate, configured approximate to each other, and operable to transfer the substrate therebetween. The apparatus also includes a first lens system configured to expose the substrate in the first substrate stage and a second lens system, having a higher resolution than that of the first lens system, configured to expose the substrate positioned to the second substrate stage.

In some embodiments, the first lens system may be configured to expose edge fields of the substrate in the first substrate stage. The second lens system may be configured to expose major fields of the substrate when transferred to the second substrate stage. The substrate may include an imaging layer coated thereon. The substrate may include a semiconductor wafer. The lithography apparatus may further include a radiation source configured to provide at least one of the first radiation energy and the second radiation energy.

The present disclosure also provides a lithography process. In one embodiment, the process includes loading a substrate to a first substrate stage; exposing edge fields of the substrate utilizing a first lens system; transferring the substrate to a second substrate stage; and exposing major fields of the substrate utilizing a second lens system having a high resolution than that of the first lens system.

In some embodiments, the process may further include forming an photoresist layer on the substrate before the loading of the substrate. The substrate may include a silicon wafer. The process may further include exposing edge fields of a second substrate utilizing the first lens system during the exposing major fields of the substrate utilizing the second lens system. The process may further include utilizing a first mask having dummy patterns designed for edge fields of the substrate. The first mask may be selected from a set of masks having dummy patterns for various substrates. The process may further include aligning and leveling the substrate after the loading of the substrate to the first substrate stage.

The present disclosure has been described relative to a preferred embodiment. Improvements or modifications that become apparent to persons of ordinary skill in the art only after reading this disclosure are deemed within the spirit and scope of the application. It is understood that several modifications, changes and substitutions are intended in the foregoing disclosure and in some instances some features of the invention will be employed without a corresponding use of other features. Accordingly, it is appropriate that the appended claims be construed broadly and in a manner consistent with the scope of the invention.

What is claimed is:

1. A lithography apparatus, comprising:
   a first lens system;
   a first substrate stage configured to receive a first radiation energy from the first lens system, and designed operable to support relative movement between the substrate and a first image source during an exposing process;
   a second lens system, having a higher resolution than that of the first lens system; and
   a second substrate stage approximate to the first substrate stage and configured to receive a second radiation energy from the second lens system, and designed operable to receive the substrate from the first substrate stage and support relative movement between the substrate and a second image source.

2. The apparatus of claim 1, wherein the first substrate stage is operable to align and level the substrate.

3. The apparatus of claim 1, wherein the first image source is a first mask, and wherein the first lens is configurable to incorporate the first radiation energy with image information from the first mask and expose edge fields of the substrate positioned on the first substrate stage.

4. The apparatus of claim 3, wherein the first mask comprises a dummy pattern to be transferred on edge fields of the substrate.

5. The apparatus of claim 3, wherein the first mask is selected from a set of masks designed for forming dummy patterns on various substrates.

6. The apparatus of claim 1, wherein the second image source is a second mask, and wherein the second lens system is configurable to incorporate the second radiation energy with image information from the second mask and expose edge fields of the substrate positioned on the second substrate stage.

7. The apparatus of claim 1, further comprising a radiation source configured to provide both the first radiation energy and the second radiation energy.

8. A lithography apparatus, comprising:
   a first substrate stage and a second substrate stage configured for securing and moving a substrate, wherein the first and second substrate stages are configured approximate to each other and are operable to transfer the substrate therebetween;
   a first lens system configured to expose the substrate in the first substrate stage; and
   a second lens system, having a higher resolution than that of the first lens system, configured to expose the substrate positioned to the second substrate stage.

9. The apparatus of claim 8, wherein the first lens system is configured to expose edge fields of the substrate in the first substrate stage.

10. The apparatus of claim 8, wherein the second lens system is configured to expose major fields of the substrate when transferred to the second substrate stage.

11. The apparatus of claim 8, wherein the substrate comprises an imaging layer coated thereon.

12. The apparatus of claim 8, wherein the substrate comprises a semiconductor wafer.

13. The apparatus of claim 8, further comprising a radiation source configured to provide at least one of the first radiation energy and the second radiation energy.

14. A lithography process, comprising:
    loading a substrate to a first substrate stage;
    exposing edge fields of the substrate utilizing a first lens system;
    transferring the substrate to a second substrate stage; and
    exposing major fields of the substrate utilizing a second lens system having a high resolution than that of the first lens system.

15. The process of claim 14, further comprising forming an photoresist layer on the substrate before the loading of the substrate.

16. The process of claim 14, wherein the substrate comprises a silicon wafer.

17. The process of claim 14, further comprising exposing edge fields of a second substrate utilizing the first lens system during the exposing major fields of the substrate utilizing the second lens system.

18. The process of claim 14, further comprising utilizing a first mask having dummy patterns designed for edge fields of the substrate.

19. The process of claim 18, wherein the first mask is selected from a set of masks having dummy patterns for various substrates.

20. The process of claim 14, further comprising aligning and leveling the substrate after the loading of the substrate to the first substrate stage.

* * * * *